(12) United States Patent
Han et al.

(10) Patent No.: US 11,849,625 B2
(45) Date of Patent: Dec. 19, 2023

(54) DISPLAY APPARATUS

(71) Applicant: LG Display Co., Ltd., Seoul (KR)

(72) Inventors: SunWoong Han, Seoul (KR); HyunSeung Lee, Paju-si (KR); Sang-Il Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 65 days.

(21) Appl. No.: 17/523,834

(22) Filed: Nov. 10, 2021

(65) Prior Publication Data

US 2022/0165815 A1  May 26, 2022

(30) Foreign Application Priority Data

Nov. 26, 2020  (KR) .................. 10-2020-0161267

(51) Int. Cl.
*G02F 1/1333* (2006.01)
*H10K 59/65* (2023.01)
*H10K 50/844* (2023.01)
*G02F 1/1339* (2006.01)

(52) U.S. Cl.
CPC .......... *H10K 59/65* (2023.02); *H10K 50/844* (2023.02); *G02F 1/1339* (2013.01); *G02F 1/13338* (2013.01)

(58) Field of Classification Search
CPC .................................................. G02F 1/13338
See application file for complete search history.

(56) References Cited

U.S. PATENT DOCUMENTS

| | | | |
|---|---|---|---|
| 10,516,011 B2 | 12/2019 | Lee et al. | |
| 10,818,742 B2 * | 10/2020 | Park | H10K 50/84 |
| 2018/0151647 A1 | 5/2018 | Lee et al. | |
| 2020/0176520 A1 * | 6/2020 | Kim | H10K 50/844 |

FOREIGN PATENT DOCUMENTS

| | | |
|---|---|---|
| KR | 10-2018-0061903 A | 6/2018 |
| KR | 10-2020-0067576 A | 6/2020 |

* cited by examiner

*Primary Examiner* — Edmond C Lau
(74) *Attorney, Agent, or Firm* — Fenwick & West LLP

(57) ABSTRACT

According to an exemplary embodiment of the present disclosure, there is provided a display apparatus more stable to penetration of moisture and oxygen, including a panel including a display area, a camera hole area, and a non-display area disposed between the display area and the camera hole area, a light emitting element and a plurality of transistors disposed in the display area on the panel, an encapsulation layer disposed on the light emitting element and the transistors, and at least one camera hole, at least one connection prevention part, and at least one dam disposed in the camera hole area, in which a respective one of the at least one dam is disposed between a respective one of the at least one connection prevention part and a respective one of the at least one camera hole.

25 Claims, 12 Drawing Sheets

US 11,849,625 B2

DISPLAY APPARATUS

CROSS-REFERENCE TO RELATED APPLICATIONS

This application claims the priority of Republic of Korea Patent Application No. 10-2020-0161267 filed on Nov. 26, 2020, in the Korean Intellectual Property Office, the disclosure of which is incorporated herein by reference in its entirety.

BACKGROUND

Field

The present disclosure relates to a display apparatus, and more particularly, to a display apparatus having a camera hole.

Description of the Related Art

Recently, with the entrance of the information age, a display field for visually expressing electrical information signals has been rapidly developed, and accordingly, various display apparatuses having excellent performance such as slimness, light weight, and low power consumption have been developed.

Specific examples of such display apparatuses may include a liquid crystal display (LCD) apparatus, an organic light emitting display (OLED) apparatus, a quantum dot display apparatus, and the like.

The display apparatus may also include a display panel and a plurality of components for providing various functions. For example, in existing display apparatuses, cameras and various optical sensors are disposed at the outside of the display panel and have performed a variety of functions, such as photographing, facial recognition, and infrared distance measurement. However, over the generations, as so-called bezel less or bezel free designs, in which a display area seems to be full when a user views the display apparatus, are gradually generalized, the arrangement of the cameras and optical sensors has become difficult. In order to achieve these bezel less or bezel free designs, a method for moving the cameras and the optical sensors to the inside of an active area of the display panel has been studied. As a result of the study, a technique called a hole-in display has been developed to dispose the cameras and the optical sensors in a hole in the display panel by forming the hole in the display panel.

As the hole-in display is developed and the cameras and the sensors which have been disposed in the existing bezel area are moved inside the display panel area, extreme bezel less or bezel free designs may be applied.

SUMMARY

The inventors of the present disclosure have recently conducted studies to reduce a space for disposing cameras and various sensors in smart devices. In order to dispose the cameras and the sensors, a part of the front display area of the smart devices needs to be allocated for cameras and sensors, and as a result, the display area of the display panel has no choice but to be reduced. Further, there is a need to further overcome the limitations of the display area according to the tendency of disposing more various types of cameras and sensors on the front surface of the display area. For example, a variety of accessories such as a front wide-angle camera, a depth camera, face recognition sensors, and infrared distance measurement sensors have been able to be disposed on the front surface of the display apparatus, and enlargement of the non-display area for this caused side effects of reducing the aesthetics from the user's point of view. In order to dispose the cameras and the sensors on the front surface while the display area is maintained, a hole-in display was developed, but side effects thereof also occurred. The inventors recognized that in order to implement the hole-in display, there was a need to block the occurrence of cracks in a camera hole area and penetration of moisture and to this end, various techniques were required.

Accordingly, the inventors of the present disclosure invented a new structure and a manufacturing method thereof to suppress moisture and oxygen from penetrating through an organic light emitting stack. Furthermore, for example, the new structure may block cracks due to transfer of thermal energy occurring when the substrate is cut by using a laser.

For example, it was confirmed that when the laser is irradiated to a cutout portion of the substrate, the thermal energy is transferred through the substrate and may cause the deformation in organic insulating films and inorganic insulating films which are continuously disposed from the display area. The resulting deformation is gradually enlarged due to a phenomenon that the stress is concentrated in a defect portion to become cracks. The formed cracks have characteristics to be easily propagated through the insulating films, particularly the inorganic insulating films and may be propagated up to the display area of the display panel to cause deterioration of display performance. For example, according to an embodiment of the present disclosure, in order to suppress the cracks caused by this deformation, it is possible to set an area to remove the organic insulating films or the inorganic insulating films so as to be spaced apart from a laser irradiation region at a predetermined distance. Accordingly, even if the substrate is removed by the laser, a substrate having low thermal conductivity absorbs all of the generated thermal energy and does not transfer the thermal energy to the organic insulating films or the inorganic insulating film insulating films, and as a result, it is possible to suppress the crack from occurring due to deformation of the insulating films.

It was confirmed that when the moisture penetrates through the organic light emitting stack exposed while the camera hole area is formed, the moisture has characteristics to be reacted and propagated along the organic light emitting stack. The moisture propagated thus reaches pixels disposed in the display area of the display panel to cause deterioration of the display performance. The inventors have proposed a new structure to suppress the moisture from being propagated through the organic light emitting stack. For example, by using the characteristic of the organic light emitting stack formed through chemical deposition, an area where the organic light emitting stack is disconnected may be set in the vicinity of the camera hole area. Accordingly, it is possible to suppress the moisture and oxygen introduced from the camera hole area from being transmitted to the display area in the display panel from the area where the organic light emitting stack is disconnected. By disposing the area where the organic light emitting stack is disconnected in the vicinity of the camera hole area, it is possible to suppress the moisture and oxygen from being propagated to the display area of the display panel.

For example, in the encapsulation layer for protecting an organic light emitting element, a foreign material compensation layer may be suppressed from overflowing to the camera hole area. A structure for blocking interference between the cameras and the sensors to be disposed in the camera hole and the foreign material compensation layer is disposed to reduce defects such as lifting or contamination in camera when combined with the upper substrate.

For a design of a bezel less or bezel free type display panel, which is a trend in the development of the display apparatus, it will be focused on a method for suppressing the display quality from being deteriorated even while the hole for placing the cameras and the sensors is disposed in the display area.

According to an aspect of the present disclosure, there is provided a display apparatus including a panel including a display area, a camera hole area, and a non-display area disposed between the display area and the camera hole area, a light emitting element and a plurality of transistors disposed in the display area on the panel, an encapsulation layer disposed on the light emitting element and the transistors, and at least one camera hole, at least one connection prevention part, and at least one dam disposed in the camera hole area, in which a respective one of the at least one dam may be disposed between a respective one of the at least one connection prevention part and a respective one of the at least one camera hole.

According to another aspect of the present disclosure, there is provided a display apparatus including a light emitting element and a plurality of transistors disposed in the display area on the panel, an encapsulation layer disposed on the light emitting element and the transistors, a camera hole disposed in the camera hole area, at least one connection prevention part and at least one dam having a closed loop structure around the camera hole, and a power line and a signal line disposed in the non-display area, in which a respective one of the at least one dam may be disposed between a respective one of the at least one connection prevention part and a corresponding camera hole.

According to another aspect of the present disclosure, a display apparatus includes a panel including a substrate and having a display area, a camera hole area formed with a camera hole, and a non-display area disposed between the display area and the camera hole area. The display apparatus further includes a light emitting element and a plurality of transistors disposed in the display area on the panel, and an encapsulation layer disposed on the light emitting element and the plurality of transistors. The display apparatus further includes at least one connection prevention part in the camera hole area, wherein the at least one connection prevention part includes one or more structures each having a first portion having a first width and a second portion above the first portion having a second width wider than the first width, and at least one dam disposed between the at least one connection prevention part and the camera hole.

According to another aspect of the present disclosure, a display apparatus includes a panel including a substrate and having a display area, a camera hole area formed with a camera hole, and a non-display area disposed between the display area and the camera hole area. The display apparatus further includes a light emitting element and a plurality of transistors disposed in the display area on the panel, and an encapsulation layer disposed on the light emitting element and the plurality of transistors. The display apparatus further includes at least one connection prevention part in the camera hole area, wherein the at least one connection prevention part includes one or more structures each having a first portion having a first width and a second portion above the first portion having a second width wider than the first width, and at least one dam disposed between the at least one connection prevention part and the camera hole, the at least one dam continuously formed around the camera hole, and a power line and a signal line disposed in the non-display area.

According to another aspect of the present disclosure, a display apparatus includes a panel including a substrate and having a display area, a camera hole area formed with a camera hole, and a non-display area disposed between the display area and the camera hole area. The display apparatus further includes a light emitting element including a light emitting stack, and a plurality of transistors disposed in the display area on the panel, and a connection prevention part on an insulating film on the substrate, wherein the connection prevention part includes one or more structures each having a first portion having a first width and a second portion above the first portion having a second width wider than the first width, and a dam disposed in the camera hole area, wherein the dam is disposed between the connection prevention part and the camera hole, and wherein a first part of the light emitting stack is disposed on the insulating film adjacent to a side surface of the at least one connection prevention part, and a second part of the light emitting stack is disposed on a top surface of the at least one connection prevention part, and wherein the first part is disconnected from the second part.

Other detailed matters of the exemplary embodiments are included in the detailed description and the drawings.

According to the exemplary embodiments of the present disclosure, it is possible to provide a display apparatus in which a camera hole may be disposed inside the display area of the display panel and thus, an appearance of the display panel has a slim bezel or a narrow bezel.

Accordingly, a user of the display apparatus may use a device in which a light emitting screen is aesthetically full on the front surface of the display apparatus, and a more excellent grip effect and a light weight may be provided to the user by using a compact module to be applied to a functionally narrow bezel.

According to the exemplary embodiments of the present disclosure, it is possible to suppress the penetration of moisture and oxygen introduced from the camera hole by forming a plurality of prevention parts in the peripheral portion of the camera hole. For example, the prevention parts may block a moving path of moisture and oxygen by disconnecting the organic common layer, that is, the light emitting stack of the light emitting element disposed on the front surface of the display panel.

For example, referring to the deposition direction of the organic material has straightness in the organic material deposition process for forming the light emitting stack, a vertical structure of the prevention part structure is heightened, so that a side portion of the prevention part structure may be elongated or a width of the side portion may be varied. The side portion of the prevention part structure different from the deposition direction of the organic material, or the side portion of the prevention part structure that is perpendicular to the deposition direction, the organic material is not laminated or has no choice but to be unevenly laminated. As a result, on the side portion of the prevention part structure, the material constituting the light emitting stack is not laminated or unevenly laminated to be structurally separated.

For example, a plurality of dams may be disposed in the vicinity of the prevention parts to suppress the organic insulating layer of the encapsulation layer from overflowing to the camera hole. The plurality of dams may suppress interference between the contamination of the camera hole area which may occur when the organic insulating layer overflows to the camera hole and the cameras to be disposed in the camera hole area.

For example, the prevention part structures may be disposed at a plurality of positions to block the moisture and oxygen penetrating from the camera hole, and when applying the advantages and disadvantages of each structure by varying the prevention part structures such as a taper or a reversed taper, the prevention part structures may have a more excellent effect of blocking moisture and oxygen.

The effects of the present disclosure are not limited to the aforementioned effects, and other effects, which are not mentioned above, will be clearly understood to those skilled in the art from the following description.

The contents of the disclosure disclosed in the technical object, the technical solution, and the effects above do not specify the required features of the appended claims, and thus, the scope of the claims is not limited by the matters described in the contents of the disclosure.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Figure 1:
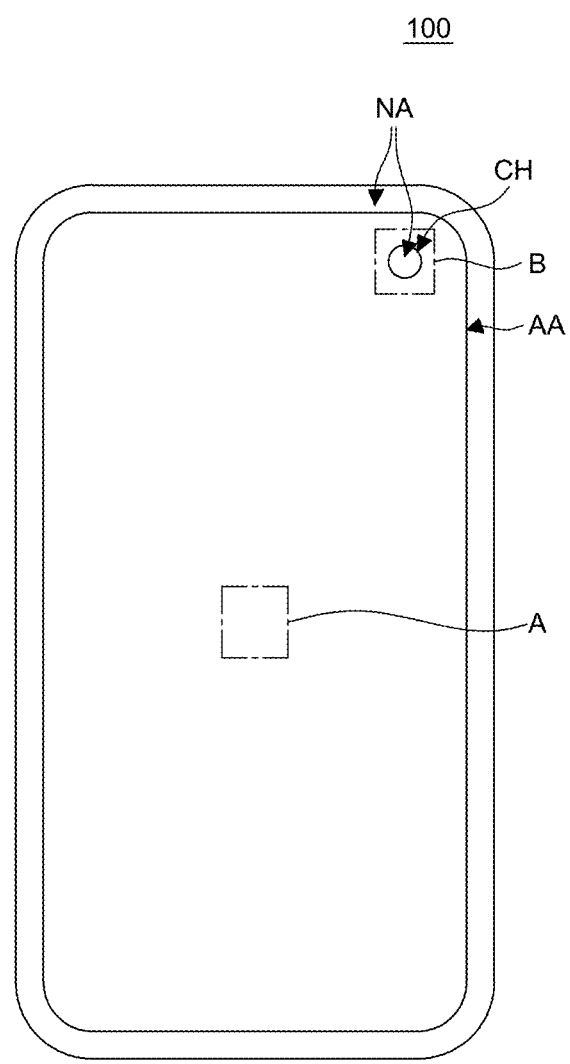
FIG. 1 is a view illustrating a front surface of a display panel according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element is not limited by the terms. It will be understood that when an element described as being "connected", "coupled", or "adhered" to another element or layer, the element may be directly connected, coupled or adhered to the other element or layer, but the other element or layer may be "disposed" between elements, or elements may be "connected", "coupled", or "adhered" to each other through the other element.

In the present disclosure, a "display apparatus" may include display apparatuses in a narrow sense, such as a liquid crystal module (LCM), an OLED module, and a quantum dot module including a display panel and a driver for driving the display panel. In addition, the display apparatus may include an equipment display apparatus including a laptop computer, a television, a computer monitor which are complete products or final products including the LCM, the OLED module, the QD module, etc., an automotive display or other displays of vehicles, etc., and a set electronic device or a set device or set apparatus such as a mobile electronic device of a smart phone, an electronic pad, etc.

Accordingly, the display apparatus herein may include a display apparatus itself in a narrow sense such as the LCM, the OLED module, the QD module, etc., and application products or set devices as final consumer devices, including the LCM, the OLED module, the QD module, etc.

In addition, in some cases, the LCM, the OLED module, and the QD module constituted by the display panel, the driver, etc. are expressed as the "display apparatus" in a narrow sense, and an electronic device as a complete product including the LCM, the OLED module, and the QD module may be separately expressed as the "set device". For example, the display apparatus in a narrow sense includes a display panel of a liquid crystal (LCD), an organic light emitting diode (OLED) or a quantum dot, and a source PCB which is a controller for driving the display panel. The set device may be a concept of further including a set PCB which is a set controller which is electrically connected to the source PCB to control the entire set device.

The display panel used in the exemplary embodiment may use all types of display panels, such as a liquid crystal display (LCD) panel, an organic light emitting diode (OLED) display panel, a quantum dot (QD) display panel, and an electroluminescent display panel. The display panel is not limited to a specific display panel capable of bending a bezel with a flexible substrate for the OLED display panel in the exemplary embodiment and a lower back plate support structure. In addition, the display panel used in the display apparatus according to the exemplary embodiment of the present disclosure is not limited by the shape or size of the display panel.

More specifically, in the case of the OLED display panel, the display panel may include a plurality of gate lines and data lines, and pixels formed in cross areas of the gate lines and the data lines. In addition, the display panel may be configured by including an array including a thin film transistor as an element for selectively applying a voltage to each pixel, an OLED layer on the array, an encapsulation substrate or encapsulation layer disposed on the array to cover the OLED layer, etc. The encapsulation layer may protect the thin film transistor and the OLED layer from external impacts and may suppress moisture or oxygen from penetrating into the OLED layer. In addition, the layer formed on the array may include an inorganic light emitting layer, for example, a nano-sized material layer, a quantum dot, or the like.

In the present disclosure, FIG. 1 illustrates an OLED display panel 100 which may also be integrated into display apparatuses.

FIG. 1 is a view illustrating a plan view of a display panel 100 according to an exemplary embodiment of the present disclosure. FIG. 1 illustrates an OLED display panel 100 which may also be integrated into display apparatuses. Referring to FIG. 1, in the OLED display panel 100, a hole CH of cameras and sensors is disposed inside a display area AA to reduce a bezel area as a non-display area and increase (for example, maximize) the display area AA. Products with a design that increases (for example, maximizes) the display area AA may be aesthetically further preferred by improving (for example, maximizing) the user's screen immersion.

The hole CH of the cameras and the sensors may be one hole as expressed in FIG. 1, but is not limited thereto, and may be variously disposed. For example, one to two holes are disposed inside the display area AA, in which the camera may be disposed in a first hole, and a distance sensor or a facial recognition sensor and a wide-angle camera may be disposed in a second hole.

Figure 2:
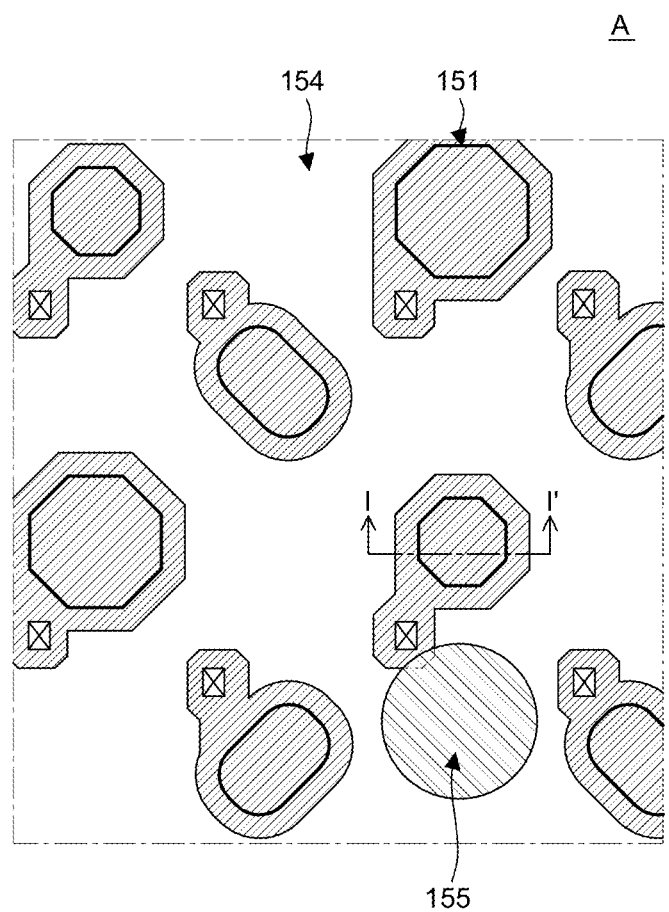
FIG. 2 is a plan view illustrating a display area by enlarging a region A of FIG. 1 according to an embodiment of the present disclosure.

FIG. 2 illustrates a planar shape of subpixels disposed in the display area AA by enlarging a region A which is a part of the display area AA of the display panel 100 of FIG. 1.

In FIG. 2, a plurality of anodes (or anode electrodes) 151 are disposed in the display area AA, and a bank 154 may be filled in an area between the anodes 151. The bank 154 may be disposed to cover an edge portion of the anode 151 and may serve to define an emission area of the subpixel by contacting only a middle portion of the anode 151 with an organic light emitting stack. A spacer 155 may be disposed in a part of the area where the bank 154 is disposed. The spacer 155 may be disposed to have a predetermined density in the entire display panel 100. The spacer 155 may serve to support a mask so that a deposition mask for covering or opening an organic layer for each subpixel is not in direct contact with the display panel 100 when a deposition process is performed to form the organic light emitting stack. FIG. 2 illustrates a pentile type planar structure in which subpixels are disposed in dot forms as an example, but is not limited thereto, and a real type planar structure may also be applied.

Figure 3:
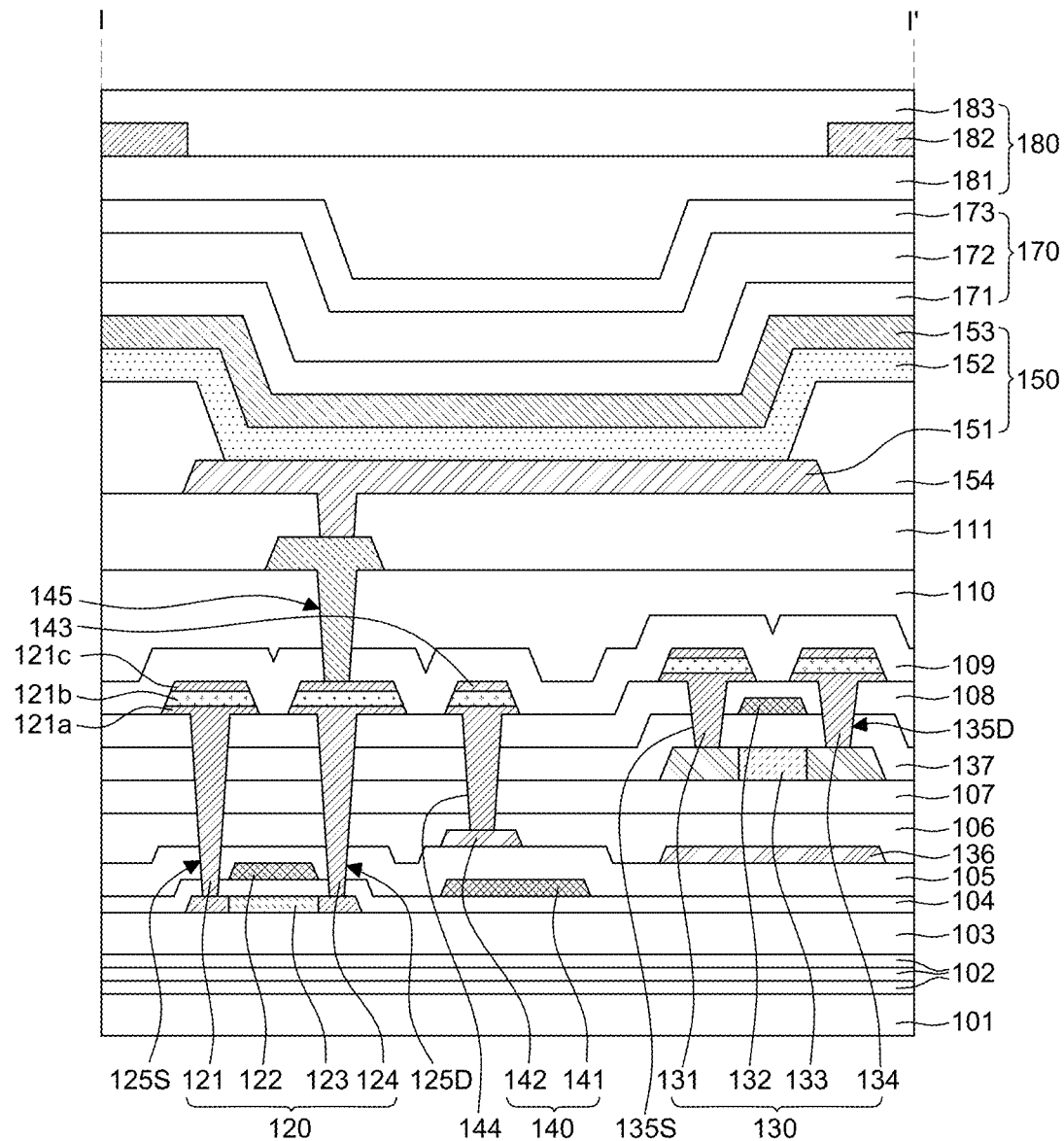
FIG. 3 is a cross-sectional view of a subpixel taken along line I-I' of FIG. 2 according to an embodiment of the present disclosure.

FIG. 3 illustrates a cross-sectional structure of a subpixel taken along line I-I' of FIG. 2.

Referring to FIG. 3, the subpixel may include a substrate 101, a multi-buffer layer 102, and a lower buffer layer 103, and a first transistor 120 may be disposed on the lower buffer layer 103. A first semiconductor layer 123 configuring the first transistor 120 and a lower gate insulating film 104 for insulation from a first gate electrode 122 on the first semiconductor layer 123 may be disposed. A first lower interlayer insulating film 105 and a second lower interlayer insulating film 106 may be sequentially disposed on the first gate electrode 122, and an upper buffer layer 107 may be disposed.

The multi-buffer layer 102 may delay moisture or oxygen penetrating into the substrate 101 from being diffused, and may be formed by alternately laminating silicon nitride SiNx and silicon oxide SiOx at least once.

The lower buffer layer 103 may protect the first semiconductor layer 123 and may perform a function of blocking various types of defects introduced from the substrate. The lower buffer layer 103 may be formed of a-Si, silicon nitride SiNx, silicon oxide SiOx, or the like.

The first semiconductor layer 123 of the first transistor 120 such as a thin film transistor may be formed of a polycrystalline semiconductor layer, and the first semiconductor layer 123 may include a channel region, a source region and a drain region.

The polycrystalline semiconductor layer has a higher mobility than an amorphous semiconductor layer and an oxide semiconductor layer, so that the energy consumption power is low and the reliability is excellent. With these advantages, the polycrystalline semiconductor layer may be used in a driving transistor.

The first gate electrode 122 may be disposed on the lower gate insulating film 104, and may be disposed to overlap with the first semiconductor layer 123.

A second transistor 130 may be disposed on the upper buffer layer 107, and a light shielding layer 136 may be disposed below a region corresponding to the second transistor 130. Referring to FIG. 3, the light shielding layer 136 is disposed on the first lower interlayer insulating film 105 of the region corresponding to the second transistor 130, and the second semiconductor layer 133 of the second transistor 130 may be disposed on the second lower interlayer insulating film 106 and the upper buffer layer 107 so as to overlap with the light shielding layer 136. An upper gate insulating film 137 for insulating the second gate electrode 132 and the second semiconductor layer 133 may be disposed on the second semiconductor layer 133 and subsequently, the upper interlayer insulating film 108 may be disposed on the second gate electrode 132. The first gate electrode 122 and the second gate electrode 132 may be a single layer or a multi-layer made of any one of molybdenum Mo, aluminum Al, chromium Cr, gold Au, titanium Ti, nickel Ni, neodymium Nd, and copper Cu or alloys thereof, but are not limited thereto.

The first and second lower interlayer insulating films 105 and 106 may be formed of inorganic films having a higher hydrogen particle content than the upper interlayer insulating film 108. For example, the first and second lower interlayer insulating films 105 and 106 are made of silicon nitride SiNx formed in a deposition process using $NH_3$ gas, and the upper interlayer insulating film 108 may be formed of silicon oxide SiOx. Hydrogen particles included in the first and second lower interlayer insulating films 105 and 106 are diffused to the polycrystalline semiconductor layer during a hydrogenation process to fill voids in the polycrystalline semiconductor layer with hydrogen. Accordingly, the polycrystalline semiconductor layer may achieve stabilization to suppress the degradation of the characteristics of the first transistor 120. After the activation and hydrogenation process of the first semiconductor layer 123 of the first transistor 120, the second semiconductor layer 133 of the second transistor 130 may be formed, in which the second semiconductor layer 133 may be formed of an oxide semiconductor. The second semiconductor layer 133 is not exposed to a high temperature atmosphere in the activation and hydrogenation process of the first semiconductor layer 123 to suppress damage to the second semiconductor layer 133, thereby improving reliability. After the upper interlayer insulating film 108 is disposed, a first source contact hole 125S and a first drain contact hole 125D are formed so as to correspond to source and drain regions of the first transistor, and a second source contact hole 135S and a second drain contact hole 135D may be formed so as to correspond to source and drain regions of the second transistor 130, respectively. Referring to FIG. 3, the first source contact hole 125S and the first drain contact hole 125D may be continuously formed from the upper interlayer insulating film 108 to the lower gate insulating film 104, and the second transistor 130 may also have the second source contact hole 135S and the second drain contact hole 135D formed. The first source electrode 121 and the first drain electrode 124 corresponding to the first transistor 120, and the second source electrode 131 and the second drain electrode 134 corresponding to the second transistor 130 may be formed at the same time. As a result, it is possible to reduce the number of processes of forming the source and drain electrodes of each of the first transistor 120 and the second transistor 130.

The first source and drain electrodes 121 and 124 and the second source and drain electrodes 131 and 134 may be a single layer or a multi-layer made of any one of molybdenum Mo, aluminum Al, chromium Cr, gold Au, titanium Ti, nickel Ni, neodymium Nd, and copper Cu or alloys thereof, but are not limited thereto. The first source and drain electrodes 121 and 124 and the second source and drain electrodes 131 and 134 may be formed of a three-layer structure, and for example, the first source electrode 121 may consist of a first layer 121a, a second layer 121b, and a third layer 121c, and other source and drain electrodes may also have the same structure.

A storage capacitor 140 may be disposed between the first transistor 120 and the second transistor 130. As illustrated in FIG. 3, the storage capacitor 140 may be formed by overlapping a storage lower electrode 141 and a storage upper electrode 142 with the first lower interlayer insulating film 105 interposed therebetween.

The storage lower electrode 141 is located on the lower gate insulating film 104, and may be formed of the same material on the same layer as the first gate electrode 122. The storage upper electrode 142 may be electrically connected to a pixel circuit through a storage supply line 143. The storage upper electrode 142 may be formed of the same material on the same layer as the light shielding layer 136. Such a storage upper electrode 142 is exposed through a storage contact hole 144 penetrating through the second lower interlayer insulating film 106, the upper buffer layer 107, the upper gate insulating layer 137, and the upper interlayer insulating film 108 to be connected to the storage supply line 143. On the other hand, as illustrated in FIG. 3, the storage upper electrode 142 is spaced apart from the light shielding layer 136, but may also be formed in an integrated form connected to each other. The storage supply line 143 may be formed of the same material on the same plane as the first source and drain electrodes 121 and 124 or the second source and the drain electrodes 131 and 134. As a result, the storage supply line 143 is able to be formed at the same time by the same mask process as the first source and drain electrodes 121 and 124 or the second source and the drain electrodes 131 and 134.

On the substrate 101 formed with the first source and drain electrodes 121 and 124, the second source and the drain electrodes 131 and 134, and the storage supply line 143, an inorganic insulating material such as SiNx or SiOx is entirely deposited to form a protective film 109. A first planarization layer 110 may be formed on the substrate 101 formed with the protective film 109. Specifically, on the substrate 101 formed with the protective film 109, an organic insulating material such as an acrylic resin may be entirely coated to dispose the first planarization layer 110.

The protective film 109 and the first planarization layer 110 are disposed and a contact hole exposing the first source electrode 121 or the first drain electrode 124 of the first transistor 120 may be formed through a photolithography process. A connection electrode 145 made of any of Mo, Ti, Cu, Al, Nd, Al and Cr, or alloys thereof may be disposed in a contact hole area exposing the first drain electrode 124.

A second planarization layer 111 may be disposed on the connection electrode 145, a contact hole for exposing the connection electrode 145 is formed in the second planarization layer 111, and a light emitting element 150 connected with the first transistor 120 may be disposed.

The light emitting element 150 may include an anode electrode 151 connected with the first drain electrode 124 of the first transistor 120, at least one light emitting stack 152 formed on the anode electrode 151, and a cathode electrode 153 formed on the light emitting stack 152.

The light emitting stack 152 may include a hole injection layer, a hole transport layer, a light emitting layer, an electron transport layer, and an electron injection layer, and in a tandem structure in which a plurality of light emitting layers overlaps with each other, a charge generation layer may be further disposed between the light emitting layers. In the case of the light emitting layer, there may be a case of emitting light of a different color for each subpixel. For example, a red light emitting layer, a green light emitting layer, and a blue light emitting layer may be separately formed for each subpixel. However, a common light emitting layer is formed to emit white light without color division for each pixel, and a color filter that separates the colors may also be provided separately. This may be divided into an RGB type (real RGB type) and a white OLED (WOLED). The light emitting layer may be individually formed, but the injection layers or the transport layers are provided as a common layer and may be disposed equally for each subpixel.

The anode electrode 151 may be connected with the connection electrode 145 exposed through the contact hole penetrating through the second planarization layer 111. The anode electrode 151 may be formed of a multi-layer structure including a transparent conductive film and an opaque conductive film with high reflection efficiency. The transparent conductive film is made of a material having a relatively high work function, such as indium-tin-oxide ITO or indium-zinc-oxide IZO, and the opaque conductive film is formed of a single layer or multi-layer structure including Al, Ag, Cu, Pb, Mo, Ti or alloys thereof. For example, the anode electrode 151 may be formed in a structure in which the transparent conductive film, the opaque conductive film, and the transparent conductive film are sequentially laminated or formed in a structure in which the transparent conductive film and the opaque conductive film are sequentially laminated. Such an anode electrode 151 is disposed on the second planarization layer 111 so as to overlap with not only an emission area provided by the bank 154, but also a pixel circuit area where the first and second transistors 120 and 130 and the storage capacitor 140 are disposed, so that an emission area may be increased.

The light emitting stack 152 may be formed on the anode electrode 151 by laminating a hole transport layer, an organic light emitting layer, and an electron transport layer sequentially or reversely. In addition, the light emitting stack 152 may further include a charge generation layer and first and second light emitting stacks facing each other with the charge generation layer interposed therebetween.

The bank 154 may be formed to expose the anode electrode 151. The bank 154 may be formed of an organic material such as photo acryl, but may be a translucent material, but is not limited thereto, and may be formed of an opaque material to suppress light interference between subpixels.

The cathode electrode 153 may be formed on the upper surface of the light emitting stack 152 to face the anode electrode 151 with the light emitting stack 152 interposed therebetween. When the cathode electrode 153 is applied to a front emission type OLED display apparatus, the cathode electrode 153 may be formed of a transparent conductive film by forming thinly indium-tin-oxide ITO, indium-zinc-oxide IZO or magnesium-silver Mg—Ag.

The encapsulation layer 170 for protecting the light emitting element 150 may be formed on the cathode electrode 153. The light emitting element 150 reacts with external moisture or oxygen due to characteristics of the organic material of the light emitting stack 152, so that dark-spot or pixel shrinkage may occur. To suppress the problem, the light emitting element 150 may be disposed on the cathode electrode 153. The encapsulation layer 170 may be configured by a first inorganic insulating film 171 (an example of first inorganic insulating layer), a foreign material compensation layer (such as an organic insulating film) 172 (an example of organic insulating layer), and a second inorganic insulating film 173 (an example of second inorganic insulating layer).

A touch part 180 may be disposed on the upper portion of the substrate 101 formed with the encapsulation layer 170. The touch part 180 may include a first touch planarization layer 181, a touch electrode 182, and a second touch planarization layer 183. The first touch planarization layer 181 and the second touch planarization layer 183 may be disposed to remove a step at a point where the touch electrode 182 is disposed and be electrically insulated from each other well.

Figure 4:
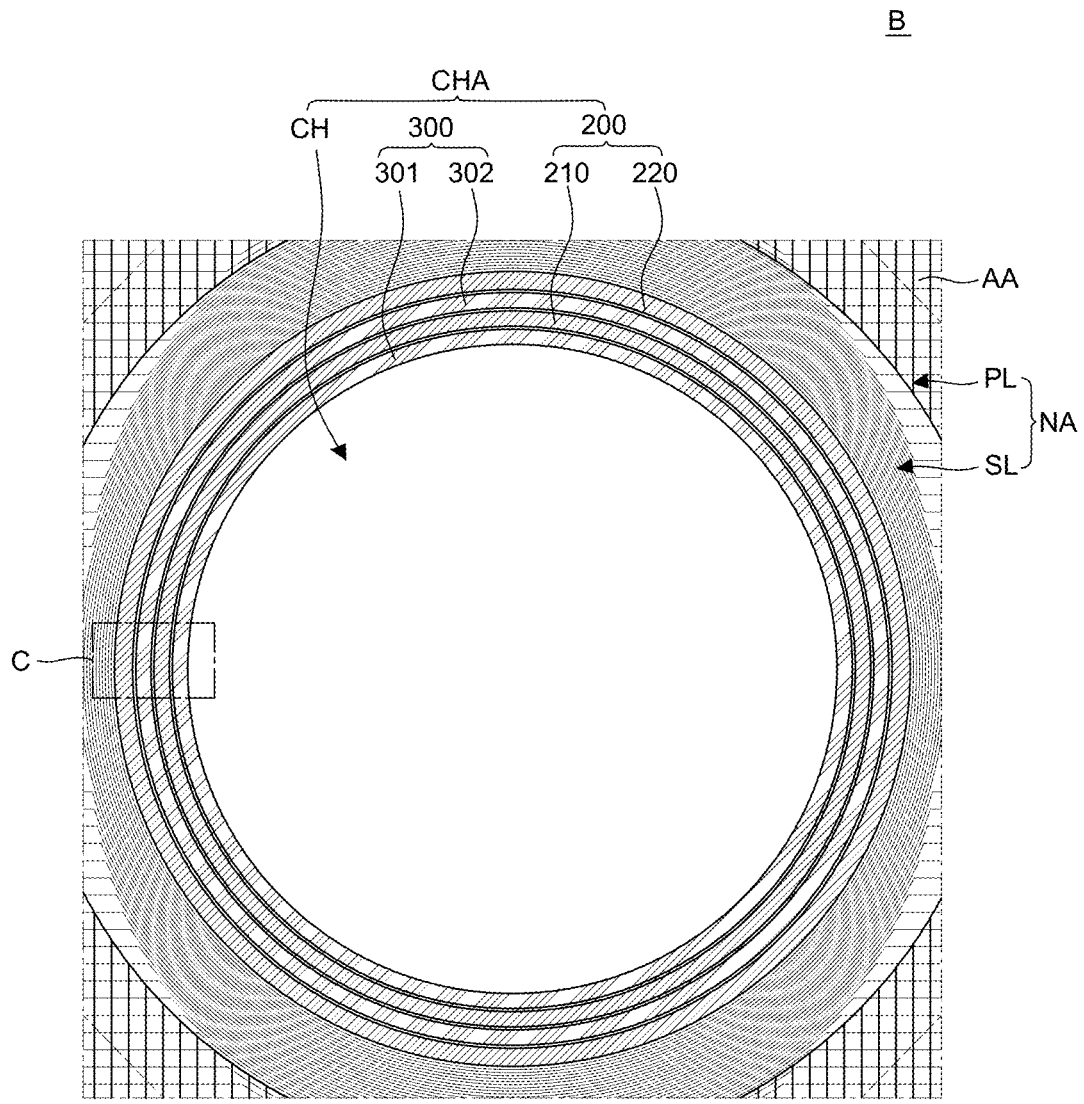
FIG. 4 is an enlarged plan view illustrating a camera hole by enlarging a region B of FIG. 1 according to an embodiment of the present disclosure.

FIG. 4 is a plan view of enlarging a region B corresponding to the camera hole area CHA of FIG. 1 according to an embodiment of the present disclosure. Referring to FIG. 4, a large camera hole CH for disposing a camera is present at the center and a camera module may be disposed in the camera hole CH. The camera hole area CHA may include all of a circular camera hole CH and an area where a dam structure 300, a connection prevention part 200, etc. are disposed around the circular camera hole CH. The camera hole CH may be removed with a laser during a panel completion step. The non-display area NA may be positioned between the camera hole area CHA and the display area AA, and may be disposed with a high-potential power line PL, a gate line SL, etc. Specifically, the high-potential power line PL and the gate line SL may be disposed to surround at least a part of the dam structure 300 and the connection prevention part 200. When the camera hole CH has a circular shape, the high-potential power line PL and the gate line SL may have a curved portion that surrounds the dam structure 300 and the connection prevention part 200. The dam structure 300 and the connection prevention part 200 may be disposed around the camera hole CH. Referring to FIG. 4, the dam structure 300 may include a first dam 301 and a second dam 302, and the connection prevention part 200 may include a first prevention part 210 and a second prevention part 220. The first dam 301, the first prevention part 210, the second dam 302, and the second prevention part 220 may be sequentially disposed around the camera hole CH. Generally, the dam structure may suppress the foreign material compensation layer 172 which is a part of the encapsulation layer outside the display panel 100 from flowing down to the end of the outside of the display panel 100 to maintain adhesion between the upper substrate and the lower substrate configuring the display panel 100. The dam structure 300 of the camera hole area CHA may also be formed in a plurality of structures such as the first dam 301 and the second dam 302 to suppress the foreign material compensation layer 172 of the encapsulation layer 170 from being invaded or leaked to the camera hole area CHA, for protecting the light emitting element 150. The connection prevention part 200 may be formed to suppress the penetration of moisture and oxygen by disconnecting the light emitting stack 152. The present disclosure has proposed two dams, but is not limited thereto, and additional dams may be further disposed according to the arrangement of the space. Referring to FIG. 4, the first prevention part 210 and the second prevention part 220 may be disposed on the inner sides of the first dam 301 and the second dam 302. A first prevention part 210 and a second prevention part 220 may be disposed for protecting the light emitting element 150 of the display area from moisture and oxygen which may be introduced from the camera hole CH. The light emitting stack 152 for the light emitting element 150 may be deposited on the front surface of the display panel 100, and may be uniformly deposited even in the camera hole area CHA. The light emitting stack 152 may transfer the moisture and oxygen to the light emitting element 150 of the display area AA due to high reactivity and dispersibility to moisture and oxygen due to the characteristics of the organic material. To suppress the problem, the first and second prevention parts 210 and 220 may allow the light emitting stack 152 to be partially disconnected. A detailed description thereof will be described in FIGS. 6 to 8 to be described below. In the present disclosure, two disconnection structures have been described, but it is not limited thereto.

Due to the arrangement of the camera hole area CHA, the light emitting element 150 and the pixel circuit in the corresponding area have been removed, but the light emitting element 150 and the pixel circuit disposed on top, bottom, left, and right sides based on the camera hole area CHA need to be electrically connected to each other. To this end, in the non-display area NA around the camera hole area CHA, the high-potential power line PL, the gate line SL, etc. may be disposed to be connected to each other up, down, left, and right by bypassing the camera hole area CHA.

Figure 5:
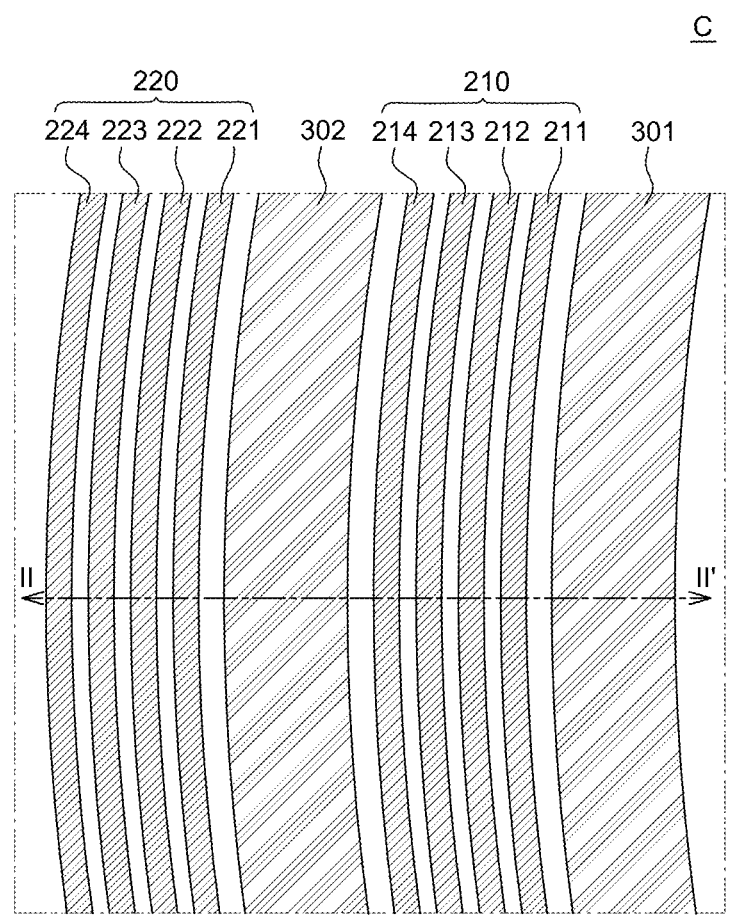
FIG. 5 is a plan view illustrating a peripheral portion of the camera hole by enlarging a region C of FIG. 4 according to an embodiment of the present disclosure.

FIG. 5 is a plan view of enlarging a region C in the camera hole area CHA of FIG. 4 according to an embodiment of the present disclosure. Referring to FIG. 5, the first prevention part 210 may be disposed between the first dam 301 and the second dam 302, and the second prevention part 220 may be disposed at a side (for example, a left side in FIG. 5) of the second dam 302 opposite to the first prevention part 210. The first prevention part 210 includes a first structure 211, a second structure 212, a third structure 213, and a fourth structure 214, and the second prevention part 220 may include a fifth structure 221, a sixth structure 222, a seventh structure 223, and an eighth structure 224. Referring to FIGS. 4 and 5, it can be seen that the first dam 310, the second dam 302, the first prevention part 210, and the second prevention part 220 are disposed in a closed loop shape around the camera hole area CHA. Thus, one or more of the first dam 310, the second dam 302, the first prevention part 210, and the second prevention part 220 may be continuously formed around the camera hole CH without a gap therebetween to form a closed loop shape when the camera hole CH is shaped circularly. The reason why the first dam 301, the second dam 302, the first prevention part 210, and the second prevention part 220 are disposed in the closed loop shape is that if any one portion is pierced, the moisture and oxygen are penetrated into the display area AA from the outside, or on the contrary, the foreign material compensation layer 172 may overflow to the camera hole area CHA and furthermore, the camera hole CH from the inside. Referring to FIG. 5, the first prevention part 210 and the second prevention part 220 may include four structures, respectively, but are not limited thereto. For example, the first prevention part 210 and the second prevention part 220 may include five or more structures, respectively, and additional prevention parts may be disposed at a side (for example, the right side in FIG. 5) of the first dam 301 opposite to the first prevention part 210, a portion adjacent to the camera hole area CHA in addition to the first prevention part 210 and the second prevention part 220. In addition to the first dam 301 and the second dam 302, additional dams may be further disposed in the non-display area NA at a side (for example, the left side in FIG. 5) of the second prevention part 220 opposite to the second dam 302. The first to eighth structures 211, 212, 213, 214, 221, 222, 223, and 224 included in the first and second prevention parts 210, 220 may have line widths of about 3 to 10 μm, but are not limited thereto.

Figure 6:
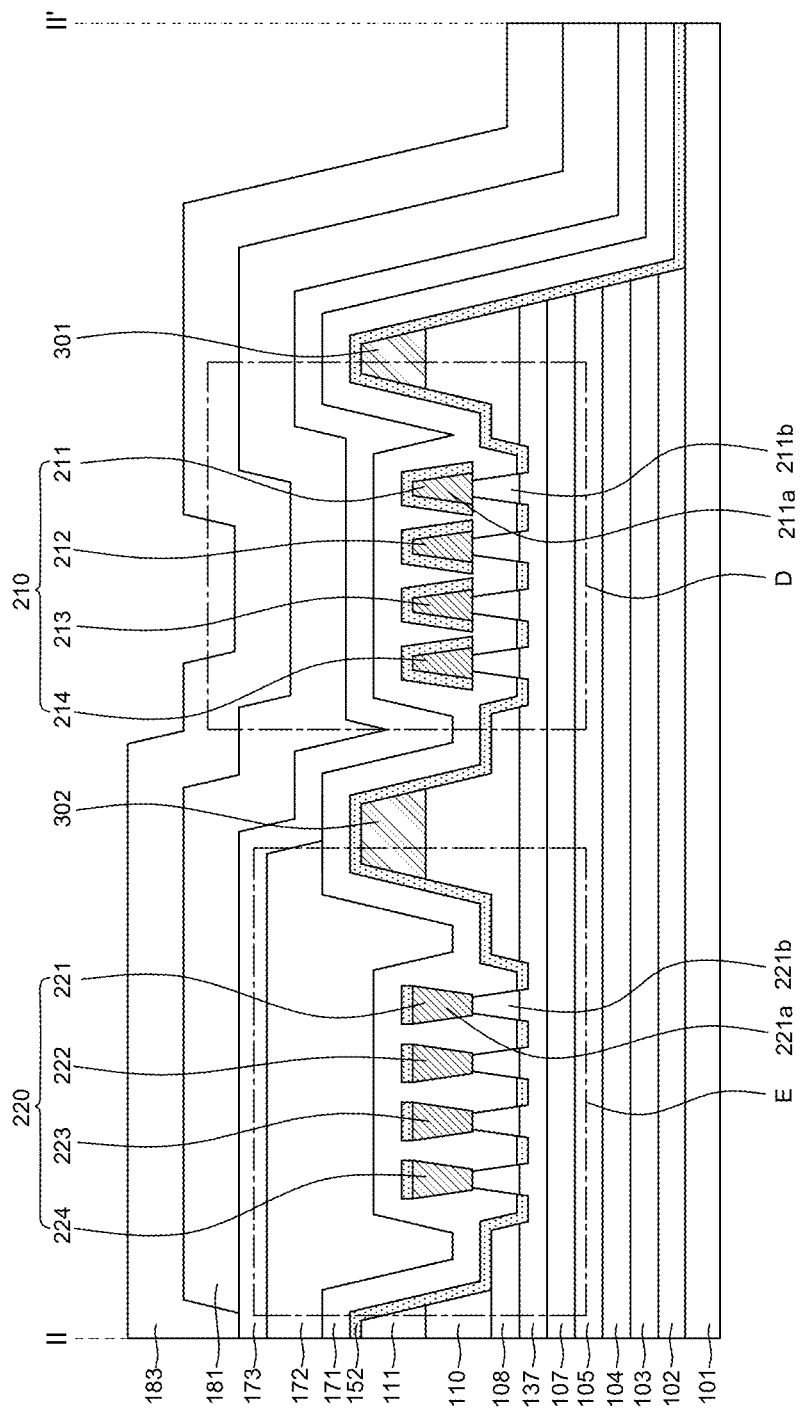
FIG. 6 is a cross-sectional view of a camera hole area taken along line II-II' of FIG. 5 according to an embodiment of the present disclosure.

FIG. 6 is a cross-sectional view illustrating a structure of II-II' of the camera hole area CHA of FIG. 5 according to an embodiment of the present disclosure. The first dam 301 and the second dam 302 are disposed around the camera hole area CHA in the closed loop shape, the first prevention part 210 is disposed between the first dam 301 and the second dam 302, and the second prevention part 220 may be disposed at the other side surface of the second dam 302 in a closed loop shape, respectively. Referring to FIG. 6, the camera hole CH may be disposed at the right side of the first dam 301. The camera hole area CHA may include at least one connection prevention part that includes one or more structures each having a first portion having a first width and a second portion above the first portion having a second width wider than the first width. Due to the structure of the at least one connection prevention part, the display apparatus may include a first part of the light emitting stack 152 disposed adjacent to a side surface of the connection prevention part, and a second part of the light emitting stack 152 disposed on a top surface of the connection prevention part, where the first part is disconnected from the second part.

Specifically, the first prevention part 210 may include a first structure 211 to a fourth structure 214, as illustrated in FIG. 6. The first structure 211 to the fourth structure 214 may be formed in a two-step structure of upper and lower portions for the disconnection of the light emitting stack 152, which may be a penetration path of moisture from the side and upper portions with the camera hole CH, and an undercut structure may be formed on the side surface of the upper portion. Specifically, the upper portion of the first structure 211 to the fourth structure 214 may be disposed to have a tapered trapezoidal cross section and the lower portion thereof may be disposed to have a quadrangular cross section having a predetermined height close to a tapered or vertical side surface. As a result, there may be a difference in width or area between the lower surface of the upper portion and the upper surface of the lower portion which are points at which the upper portion and the lower portion meet. Since the upper surface of the lower portion may be narrower than the lower surface of the upper portion, an undercut structure in which a part of the lower surface of the upper portion is exposed may be formed. As a result, the light emitting stack 152 deposited on the front surface of the display panel 100 may be disconnected by an undercut structure of an upper tip side surface of the first structure 211 to the fourth structure 214 described above. The second prevention part 220 may include the fifth structure 221 to the eighth structure 224. The fifth structure 221 to the eighth structure 224 configuring the second prevention part 220 may be formed in a two-step structure of the upper and lower portions, like the first structure 211 to the fourth structure 214. Due to the organic insulating film 172 disposed on the second prevention part 220, it is difficult to penetrate the moisture and oxygen from the upper portion, and in order to mainly block the path penetrating from the side portion where the camera hole CH or the first prevention part 210 is formed, the fifth structure 221 to the eighth structure 224 may be formed in a reversed taper structure. Specifically, the lower portion of the fifth structure 221 to the eighth structure 224 is disposed to have a trapezoidal cross section with a tapered side surface, and the upper portion thereof may be disposed to have a structure of reversing a lower cross section having a reversely tapered side surface. When the upper surface of the lower portion and the lower surface of the upper portion may be similar to each other in width or area, and as a result, the fifth structure 221 to the eighth structure 224 may have a structure similar to a large mortar or hourglass in a cross-sectional manner.

Due to the arrangement of the first prevention part 210 and the second prevention part 220, in the camera hole area CHA, it is possible to block the moisture and oxygen penetrating through the light emitting stack 152 to the light emitting element 150 of the active area AA. The camera hole area CHA may vary depending on the size of a camera to be applied to the product, and the corresponding area is showed as an empty space, but some insulating films or wiring structures may be disposed. However, a separate expression is omitted because the camera hole area is a dummy area that does not remain in the finished product when removing the camera hole area CHA with a laser. The laser may be irradiated in a circular or oval shape along the shape of the camera hole area CHA, and all the area of the upper portion including the substrate 101 may be removed through the laser irradiation. The actual camera hole area CHA and the laser irradiation region may be different from each other, and for example, the laser irradiation region in the camera hole area CHA may be an inner region of about 100 µm in the inside. Thus, only when there is a difference in the laser irradiation region and the camera hole area CHA, the insulating layer of the camera hole area CHA may not be damaged when the laser is irradiated. The laser may use a picosecond laser or a femtosecond laser, but is not limited thereto. The laser is to use light that is induced and emitted by amplifying the light generated by adding energy to a specific material, and has been used for communication or medical, and industrial purposes due to a directivity to monochromatic light and characteristics such as propagation. When the laser is used, a pattern may be formed in a desired area or a specific area may be easily removed. The laser is to form or remove the pattern using energy, and when the energy of the laser is irradiated on a subject, the subject is molten by the thermal energy to form a pattern. As the time when the laser is irradiated is increased, a thermal effect may occur to be transmitted to the vicinity of the portion formed with the pattern. In such a thermal effect, the heat is accumulated around the laser irradiation region of the subject, and thus, a larger surrounding area than the set pattern may be burned or deformed by heat. Due to the characteristics of such a laser, if the laser irradiation region overlaps with or is adjacent to the insulating film, the thermal energy of the laser may cause deformation even in the insulating film. Cracks are generated by the deformation of the insulating film, and the cracks are propagated through the insulating film, and as a result, the peeling may occur or the penetration of moisture and oxygen may occur. For example, in order to suppress deformation or peeling on insulating films such as the multi-buffer layer 102, the lower buffer layer 103, the first lower interlayer insulating film 105, the second lower interlayer insulating film 106, the upper buffer layer 107, and the upper interlayer insulating film 108, the insulating films may be fully removed at a distance of about 100 µm from a laser irradiation position. When the insulating films are fully removed, the side surfaces of the substrate 101 and the insulating films may be exposed, but the first inorganic insulating film 171 and the second inorganic insulating film 173 of the encapsulation layer 170 may cover the side surfaces. Referring to FIG. 6, the first dam 301 and the second dam 302 may have an overall width of about 50 µm, and may have a hat-like structure in which left and right side surfaces have gentle slopes, but a core region has a steep slope. For example, the width of the dam may be about 30 to 60 µm, but is not limited thereto. At this time, the width of the core region having a steep slope may be about 25 µm, but is not limited thereto. The first dam 301 and the second dam 302 may be formed by laminating the second planarization layer 111, the bank 154, and the spacer 155, but is not limited thereto, and the first planarization layer 110 may be further included or other layers may be further included. The first to fourth structures 211, 212, 213, and 214 constituting the first prevention part 210 may be made of organic materials or inorganic materials. For example, an upper portion 211*a* of the first structure 211 may be made of the same material as the first planarization layer 110 or the second planarization layer 111 and a lower portion 211*b* thereof may be made of the same material as the upper interlayer insulating film 108. The fifth to eighth structures 221, 222, 223, and 224 constituting the second prevention part 220 may be made of organic materials or inorganic materials. For example, an upper portion 221*a* of the fifth structure 221 may be made of the bank 154 or a separate organic material and a lower portion 221*b* thereof may be made of the same material as the upper interlayer insulating film 108.

The structures of the first prevention part 210 and the second prevention part 220 are differently disposed to compensate for the advantages and disadvantages of the two structures. The first prevention part 210 may be disposed in a tapered structure in which an upper eaves of the structure may be elongated to block moisture and oxygen from the upper portion without the camera hole CH or the organic insulating film 172. The upper portion of the structure of the second prevention part 220 may be formed in a reversed taper structure to block the penetration path from the camera hole CH or the first prevention part 210 well without a penetration path of moisture or oxygen at an upper side due to the organic insulating film 172 disposed on the upper portion of the second prevention part 220. The advantages and disadvantages of these structures will be described in more detail through FIGS. 7 and 8.

The encapsulation layer 170 may be disposed on an area where the first and second dams 301 and 302 and the first prevention part 210 are disposed in the same manner as the display area AA, and may include the first inorganic insulating film 171, the foreign material compensation layer 172, and the second inorganic insulating film 173. However, the foreign material compensation layer 172 may be disposed at only a part of the region around the second dam 302, but may not be disposed up to the first dam 301 region.

A first touch planarization layer 181 and a second touch planarization layer 183 may be disposed on the encapsulation layer 170.

Figure 7A:
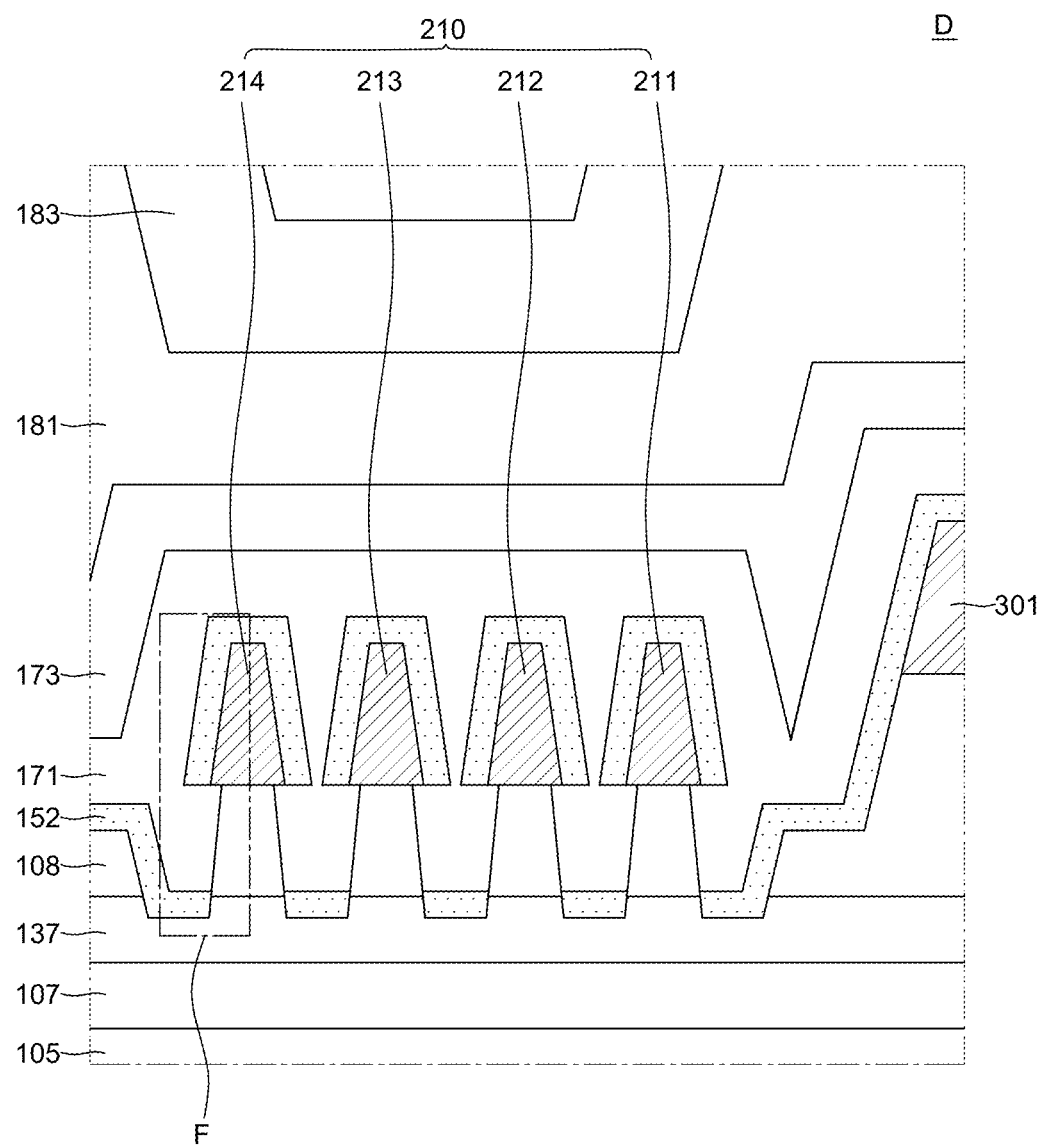
FIG. 7A is cross-sectional view of a structure by enlarging a region D of FIG. 6 according to an embodiment of the present disclosure.

FIG. 7A is a cross-sectional view of enlarging a region D of the first prevention part 210 of FIG. 6 according to an embodiment of the present disclosure. The first prevention part 210 may include the first structure 211 to the fourth structure 214, and each structure may be formed by combining the upper and lower structures. For example, the upper portion of the first structure 211 may refer to the first upper portion 211*a*, and the lower portion of the first structure 211 may refer to the first lower portion 211*b*. The upper portion and the lower portion of the first structure 211 to the fourth structure 214 are disposed to have a trapezoidal cross section with a tapered side surface to have a difference in width or area on the lower surface of the upper portion and the upper surface of the lower portion which are points where the upper portion and the lower portion meet. For example, a lower portion may have a first taper shape where a width of the lower portion incrementally or gradually increases toward the substrate, and the upper portion may have a second taper shape where a width of the upper portion incrementally or gradually increases toward the lower portion. For example, at least one of the first structure 211 to the fourth structure 214 may have a lower portion and an upper portion on the lower portion, in which a side surface of the upper portion protrudes beyond a side surface of the lower portion. Since the upper surface of the lower portion may be narrower than the lower surface of the upper portion, the protruded side surface of the upper portion may form an undercut structure in which a part of the lower surface of the upper portion is exposed may be formed. However, the structure of the lower portion is not limited to the taper and may be a vertical structure without a taper. Referring to FIG. 7A, it can be seen that the light emitting stack 152 deposited on the front surface of the display panel 100 is disconnected from upper tip side surfaces of the first structure 211 to the fourth structure 214 and the light emitting stack 152 is formed around the lower side surfaces of the first structure 211 to the fourth structure 214. The light emitting stack 152 is formed on the front surface of the display panel 100 by a chemical deposition method, in which the chemical deposition method is a method to be deposited depending on straightness of the organic material. Due to the characteristic of the light emitting stack 152 having a poor step coverage, in a place having an undercut structure due to a difference in width or area of the lower surface of the upper portion and the upper surface of the lower portion, a space where the light emitting stack 152 may not be deposited may occur in a part of the lower surface of the upper portion and the side surface of the lower portion. Due to such a space, the light emitting stack 152 and the first inorganic insulating film 171 of the encapsulation layer 170 encapsulating the light emitting stack 152 may be disconnected together. In general, the first inorganic insulating film 171 has a good step coverage as compared with the light emitting stack 152 to cover a side wall well, but in the undercut structure of the first prevention part 210, the light emitting stack 152 may be disconnected due to the empty space of the lower surface of the upper portion. The space in which the light emitting attack 152 may not be deposited will be described in FIG. 7B below.

Figure 7B:
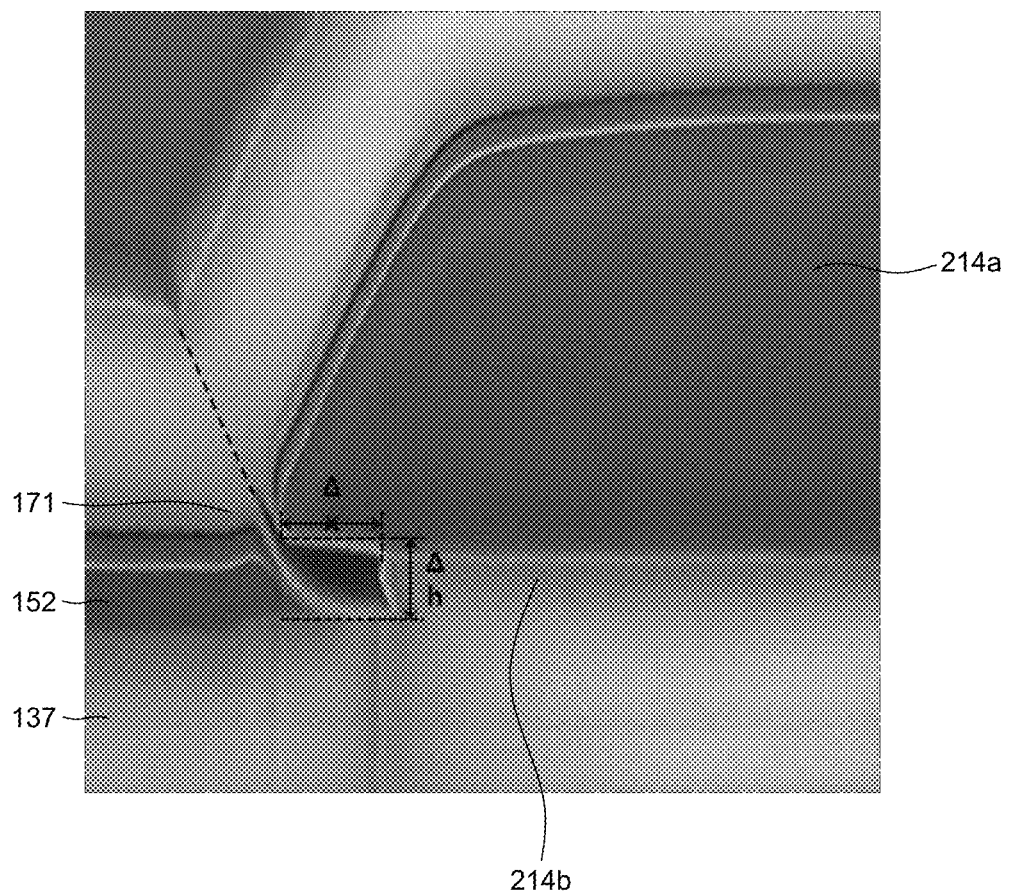
FIG. 7B is cross-sectional view of a structure by enlarging a region F of FIG. 7A according to an embodiment of the present disclosure.

FIG. 7B is a photograph showing an actual cross-sectional structure by enlarging F which is a part of the fourth structure 214 of FIG. 7A. FIG. 7B is an example tested to design an appropriate structure of the first prevention part 210 by the inventors. The fourth structure 214 may include a fourth upper portion 214a and a fourth lower portion 214b. On a lower surface of the fourth upper portion 214a, an undercut distance Δx between side surfaces of the fourth lower portion 214b and the fourth upper portion 214a and a side surface height Δh of the fourth lower portion 214b are represented. An empty space without the light emitting stack 152 or the first inorganic insulating film 171 may be formed on the lower surface of the fourth upper portion 214a and the side surface of the fourth lower portion 214b. The undercut distance Δx may also be expressed as an eaves length. In addition, it can be seen that a part of the first inorganic insulating film 171 cracks to the inner side of the first inorganic insulating film 171 around the side surface of the fourth upper portion 214a. The crack may cause a potential defect of the first inorganic insulating film 171. The cause of such a crack is that a spaced distance between an eaves end of the fourth upper portion 214a and a place where the light emitting stack 152 forms a film is formed at a level that the first inorganic insulating film 171 is not sufficiently formed. The film is formed so that a part of the first inorganic insulating film 171 extends to the fourth lower portion 214b side along the light emitting stack 152 and the other part thereof extends along the lower surface of the fourth upper portion 214a side so as to be easily separated from the undercut space. The crack of the first inorganic insulating film 171 may grow into cracks penetrating through the first inorganic insulating film 171 along a dotted line due to a phenomenon that the stress is gradually concentrated. There is a disadvantage that the crack of the first inorganic insulating film 171 may be a main penetration path of moisture or oxygen. However, this is to describe one of the characteristics of the first prevention part 210, and all the first prevention parts 210 do not cause cracks in the first inorganic insulating film 171. This may be referred to as describing the importance of a first distance Δx and a first height Δh of the first prevention part 210. In these advantages and disadvantages of the first prevention part 210, there may be an advantage that the light emitting stack 152 may be clearly disconnected due to the undercut structure by the fourth upper portion 214a and may be formed of a material used in the related art by a relatively easy process. However, there may be a disadvantage that when the undercut distance Δx of the fourth upper portion 214a and the side surface height Δh of the fourth lower portion 214b are extremely increased, the first inorganic insulating film 171 of the encapsulation layer 170 may be disconnected. In the exemplary embodiment, the first prevention part 210 has been described as a combination of four structures, but is not limited thereto.

Figure 8A:
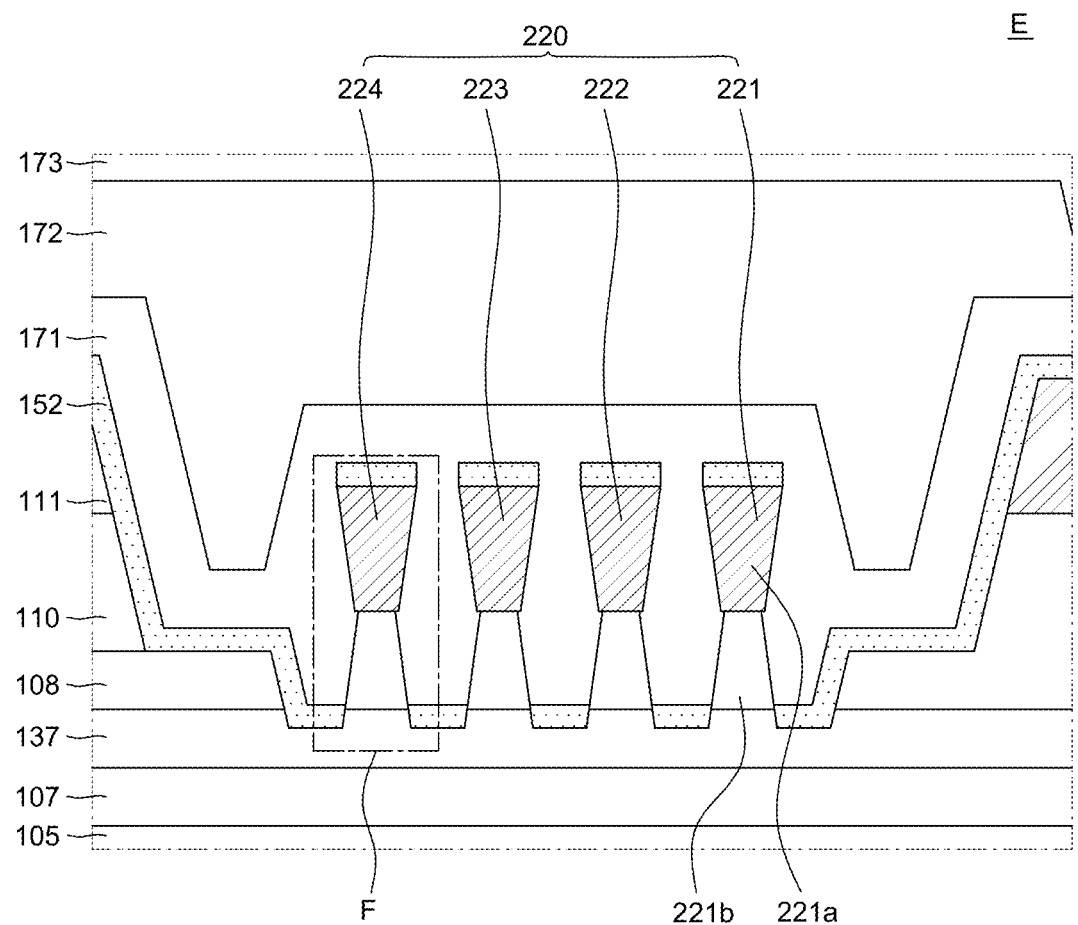
FIG. 8A is cross-sectional view of a structure by enlarging a region E of FIG. 6 according to an embodiment of the present disclosure.

FIG. 8A is a cross-sectional view of enlarging a region E of the second prevention part 220 of FIG. 6 according to an embodiment of the present disclosure. Referring to FIG. 8A, the second prevention part 220 may include the fifth structure 221 to the eighth structure 224. The fifth structure 221 to the eighth structure 224 may be formed in a two-step structure of upper and lower portions like the first structure 211 to the fourth structure 214. For example, an upper portion of the fifth structure 221 may refer to a fifth upper portion 221a and a lower portion of the fifth structure 221 may refer to a fifth lower portion 221b.

Referring to FIG. 8A, a side wall of the upper portion may be formed in a reversed taper structure where a width of the upper portion incrementally or gradually increases away from the substrate. Specifically, the lower portion of the fifth structure 221 to the eighth structure 224 is disposed to have a trapezoidal cross section with a tapered side surface, and the upper portion thereof may be disposed to have a structure of reversing a lower cross section having a reversely tapered side surface. However, the structure of the lower portion is not limited to the taper and may be a vertical structure without a taper. The upper portion may be formed of the bank 154 or another organic material, and formed by an overetching process so that the side surface is reversely tapered. When the upper surface of the lower portion and the lower surface of the upper portion may be similar to each other in width or area, and as a result, the fifth structure 221 to the eighth structure 224 may have a structure similar to a large mortar or hourglass in a cross-sectional manner. Referring to FIG. 8A, it can be seen that the light emitting stack 152 deposited on the front surface of the display panel 100 is disconnected from upper tip side surfaces of the fifth structure 221 to the eighth structure 224 and the light emitting stack 152 is formed around the lower side surfaces of the fifth structure 221 to the eighth structure 224. The light emitting stack 152 is formed on the front surface of the display panel 100 by a chemical deposition method, in which the chemical deposition method is a method to be deposited depending on straightness of the organic material. Due to a poor step coverage and a large width of the upper surface of the upper portion, a space where the light emitting stack 152 may not be deposited may occur in the side surface of the upper portion and the side surface of the lower portion. The upper reversed taper structure of the second prevention part 220 has a prevention part longer than the upper taper structure of the first prevention part 210 to further increase an effect of blocking the penetration of moisture and oxygen due to the disconnection of the light emitting stack 152. As a result, the light emitting stack 152 may be disconnected. On the other hand, the first inorganic insulating film 171 of the encapsulation layer 170 has a better step coverage than the light emitting stack 152 to cover the side surface of the second prevention part 220 well.

Figure 8B:
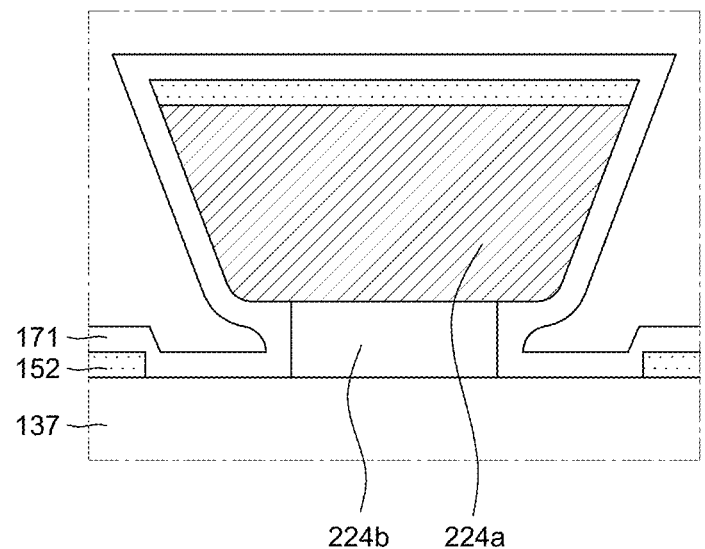
FIG. 8B is cross-sectional view of a structure by enlarging a region F of FIG. 8A according to an embodiment of the present disclosure.

FIG. 8B is a diagram illustrating F by enlarging a cross section of the eighth structure 224 of FIG. 8A. Referring to FIG. 8B, the light emitting stack 152 is disposed on the upper surface of the eighth upper portion 224a of the eighth structure 224 and may be disposed in the vicinity spaced apart from the eighth lower portion 224b of the eighth structure 224.

On the other hand, it can be seen that the first inorganic insulating film 171 is disposed to cover both the side surface and the upper surface in the vicinity of the eighth structure 224 without disconnection. Since the eighth upper portion 224a has a reversed taper structure, the first inorganic insulating film 171 may have a spatial margin which may be relatively easily formed on the side surface of the eighth structure 224. In the advantage of the second prevention part 220, first, while the light emitting stack 152 is clearly disconnected due to the reversed taper of the eighth upper portion 224a, the first inorganic insulating film 171 of the encapsulation layer 170 may be formed without disconnection. However, there may be a disadvantage of requiring an overetching process with a separate material to form a reversed taper structure of the eighth upper portion 224a.

In the exemplary embodiment, the first prevention part 210 and the second prevention part 220 are disposed in combination to have a hybrid form that reduces the disadvantages of each structure and increases the advantages of each structure.

Figure 9:
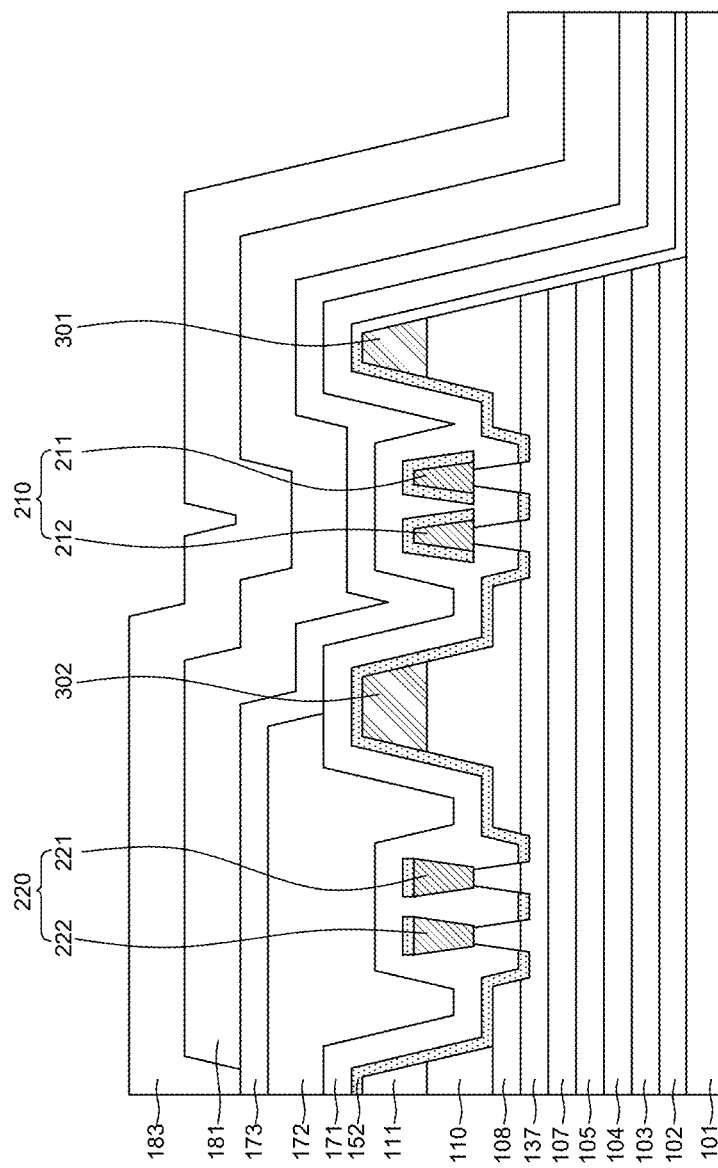
FIG. 9 is a cross-sectional view of another exemplary embodiment taken along line II-II' of FIG. 5.

FIG. 9 is a cross-sectional view illustrating another exemplary embodiment of the camera hole area CHA of FIG. 6. Referring to FIG. 9, it can be seen that the configuration of the first prevention part 210 and the second prevention part 220 is simplified compared to the exemplary embodiment of FIG. 6. Specifically, since the number of structures configuring the first prevention part 210 is reduced to two which is half compared to the exemplary embodiment of FIG. 6, and the number of structures configuring the second prevention part 220 is reduced to two which is half compared to the exemplary embodiment of FIG. 6, a structure having two structures was illustrated. In the exemplary embodiment of FIG. 9, a space of the camera hole area CHA may be reduced by about 26% as compared with the exemplary embodiment of FIG. 6, and the structures of the first prevention part 210 and the second prevention part 220 are used in combination to be optimized to suppress the penetration of moisture and oxygen.

Figure 10:
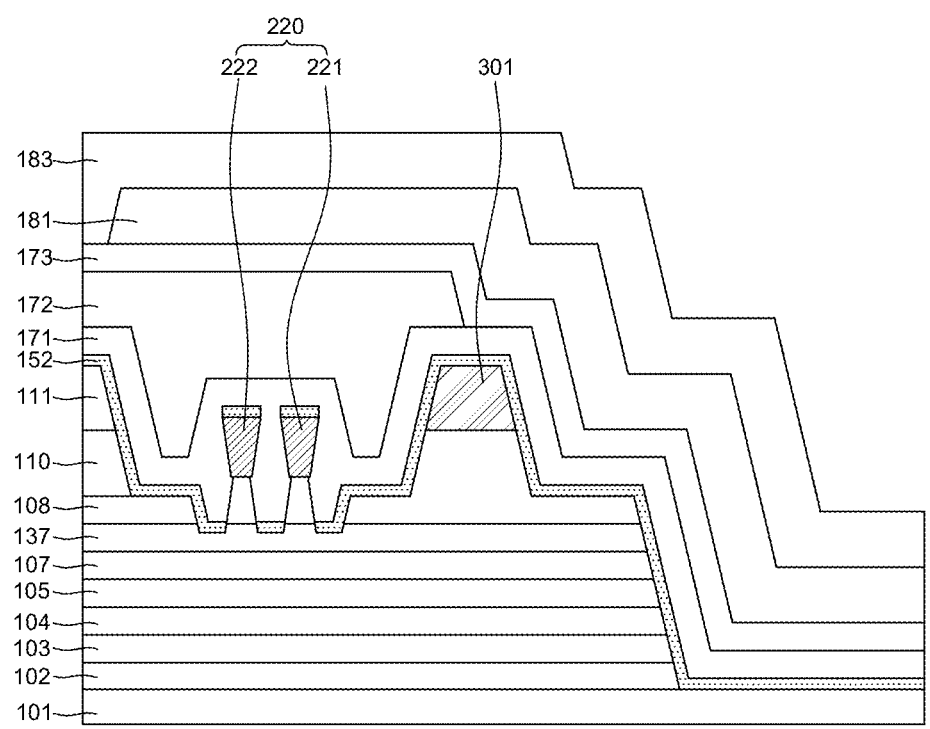
FIG. 10 is a cross-sectional view of another exemplary embodiment taken along line II-II' of FIG. 5.

FIG. 10 is a cross-sectional view illustrating another exemplary embodiment of the camera hole area CHA of FIGS. 6 and 9. Referring to FIG. 10, an example of the camera hole area CHA reduced may be seen by deleting the first prevention part 210 as compared with the exemplary embodiment of FIG. 6, and applying only a half of the structure of the second prevention part 220 like the exemplary embodiment of FIG. 9. When applying the structure of FIG. 10, about 43% of the space may be reduced as compared with the structure of FIG. 6. In FIG. 10, in order to increase the space savings in the camera hole area CHA, it can be seen that only the second prevention part 220 with a disadvantage in the process is formed. In FIG. 10, the structure of the second prevention part 220 is represented by the fifth structure 221 and the sixth structure 222, but is not necessarily limited thereto, and additional structures may be formed.

According to an exemplary embodiment of the present disclosure, a new structure has been proposed to suppress moisture and oxygen from penetrating through an organic light emitting stack while blocking cracks due to transfer of thermal energy occurring when the substrate is cut by using a laser.

The display apparatus according to the exemplary embodiment of the present disclosure includes a liquid crystal display (LCD) apparatus, a field emission display (FED) apparatus, an organic light emitting display (OLED) apparatus, and a quantum dot display apparatus.

In addition, the display apparatus according to the exemplary embodiment of the present disclosure may include an equipment display apparatus including a laptop computer, a television, a computer monitor which are complete products or final products including the LCM, the OLED module, etc., an automotive display apparatus or other displays of vehicles, etc., and a set electronic device or a set device or set apparatus such as a mobile electronic device of a smart phone, an electronic pad, etc.

The exemplary embodiments of the present disclosure can also be described as follows.

According to an aspect of the present disclosure, a display apparatus includes a panel including a display area, a camera hole area, and a non-display area disposed between the display area and the camera hole area, a light emitting element and a plurality of transistors disposed in the display area on the panel, an encapsulation layer disposed on the light emitting element and the transistors, and at least one camera hole, at least one connection prevention part, and at least one dam disposed in the camera hole area, wherein a respective one of the at least one dam is disposed between a respective one of the at least one connection prevention part and a respective one of the at least one camera hole.

The at least one connection prevention part may include a lower portion having a taper and an upper portion having a reversed taper.

The at least one connection prevention part may include a first prevention part and a second prevention part, the first prevention part is adjacent to a corresponding camera hole, and the second prevention part is adjacent to the display area.

The at least one dam may include a first dam and a second dam, the first dam is disposed between the first prevention part and the corresponding camera hole, and the second dam is disposed between the first prevention part and the second prevention part.

The first prevention part may include an upper portion having a taper, and the second prevention part includes an upper portion having a reversed taper.

The encapsulation layer may include a first inorganic insulating layer, an organic insulating layer, and a second inorganic insulating layer, and the organic insulating layer overlaps with the second prevention part.

The first inorganic layer may cover an upper surface (e.g., front surface) of the second prevention part.

The organic insulating layer may cover a side surface and a part of an upper surface of the at least one dam.

A side surface of the first dam adjacent to the corresponding camera hole may expose an upper surface of the panel and the other side surface of the first dam may be adjacent to a side surface of the first prevention part.

The display apparatus may further include a power line and a signal line disposed in the non-display area, wherein the at least one connection prevention part and the at least one dam have a closed loop structure around a respective one of the at least one camera hole, and the power line and the signal line surround the at least one connection prevention part and the at least one dam at the outside.

In the at least one connection prevention part, a light emitting layer included in the light emitting element may be disconnected.

According to another aspect of the present disclosure, a display apparatus includes a panel including a display area, a camera hole area, and a non-display area disposed between the display area and the camera hole area, a light emitting element and a plurality of transistors disposed in the display area on the panel, an encapsulation layer disposed on the light emitting element and the transistors; a camera hole disposed in the camera hole area, at least one connection prevention part and at least one dam having a closed loop structure around the camera hole, and a power line and a signal line disposed in the non-display area, wherein a respective one of the at least one dam is disposed between a respective one of the at least one connection prevention part and a corresponding camera hole.

The power line and the signal line may be disposed to surround a periphery of the at least one connection prevention part and the at least one dam.

The at least one connection prevention part may include a first prevention part and a second prevention part, the first prevention part is adjacent to a corresponding camera hole, and the second prevention part is adjacent to the display area.

The encapsulation layer may include a first inorganic insulating layer, an organic insulating layer, and a second inorganic insulating layer, and the organic insulating layer overlaps with the second prevention part.

The first prevention part may include an upper portion having a taper and the second prevention part may include an upper portion having a reversed taper.

The encapsulation layer may include a first inorganic insulating layer, an organic insulating layer, and a second inorganic insulating layer, the at least one connection prevention part includes an upper portion having a reversed taper and a lower portion having a taper or no taper, and an upper surface (e.g., front surface) of the at least one connection prevention part is covered by the first inorganic insulating layer.

In the at least one connection prevention part, a light emitting layer included in the light emitting element may be disconnected.

According to still another aspect of the present disclosure, a display apparatus includes a panel including a display area, a camera hole area, and a non-display area disposed between the display area and the camera hole area; a light emitting element and a plurality of transistors disposed in the display area on the panel, and a camera hole, a connection prevention part, and a dam disposed in the camera hole area, wherein the dam is disposed between the connection prevention part and the camera hole, and wherein, in the connection prevention part, a light emitting layer included in the light emitting element may be disconnected.

The connection prevention part may include an upper portion having a reversed taper and a lower portion having a taper.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus comprising:
a panel including a substrate and having a display area, a camera hole area formed with a camera hole, and a non-display area disposed between the display area and the camera hole area;
a light emitting element and a plurality of transistors disposed in the display area on the panel;
an encapsulation layer disposed on the light emitting element and the plurality of transistors;
at least one connection prevention part in the camera hole area, wherein the at least one connection prevention part includes one or more structures each having a first portion having a first width and a second portion above the first portion having a second width wider than the first width; and
at least one dam disposed between the at least one connection prevention part and the camera hole,
wherein the at least one connection prevention part includes a first prevention part and a second prevention part, and
wherein the at least one dam includes a first dam and a second dam, and
wherein the first dam, the first prevention part, the second dam, and the second prevention part are sequentially disposed around the camera hole.

2. The display apparatus of claim 1, wherein the one or more structures includes a structure having a lower portion and an upper portion having a reversed taper shape where a width of the upper portion incrementally increases away from the panel.

3. The display apparatus of claim 2, wherein the lower portion has a taper shape where a width of the lower portion incrementally increases toward the panel.

4. The display apparatus of claim 1, wherein the one or more structures includes a structure having a lower portion and an upper portion on the lower portion, wherein a side surface of the upper portion protrudes beyond a side surface of the lower portion.

5. The display apparatus of claim 4, wherein the protruded side surface of the upper portion forms an undercut structure exposing at least a bottom surface of the upper portion.

6. The display apparatus of claim 1, wherein the lower portion has a first taper shape where a width of the lower portion increases toward the panel, and wherein the upper portion is disposed on the lower portion and has a second taper shape where a width of the upper portion increases toward the lower portion.

7. The display apparatus of claim 1,
wherein the one or more structures include at least a first structure of the first prevention part and at least a second structure of the second prevention part,
the first prevention part is disposed between the second prevention part and the camera hole.

8. The display apparatus of claim 7,
the first dam is disposed between the first prevention part and the camera hole, and the second dam is disposed between the first prevention part and the second prevention part.

9. The display apparatus of claim 7,
wherein one of the first structure and the second structure has an upper portion on a lower portion, a side surface of the upper portion protruding beyond a side surface of the lower portion, and
the remaining one of the first structure and the second structure includes another upper portion having a reversed taper shape.

10. The display apparatus of claim 7,
wherein the encapsulation layer includes a first inorganic insulating layer, an organic insulating layer, and a second inorganic insulating layer, and
the organic insulating layer overlaps with the second prevention part.

11. The display apparatus of claim 10,
wherein the organic insulating layer covers a side surface and a part of an upper surface of the at least one dam.

12. The display apparatus of claim 1,
wherein the at least one connection prevention part is disposed on an insulating film on the substrate,
wherein the light emitting element includes a light emitting stack, a first part of the light emitting stack disposed on the insulating film adjacent to a side surface of the at least one connection prevention part, and a second part of the light emitting stack disposed on a top surface of the at least one connection prevention part, and wherein the first part is disconnected from the second part.

13. A display apparatus comprising:
a panel including a substrate and having a display area, a camera hole area formed with a camera hole, and a non-display area disposed between the display area and the camera hole area;
a light emitting element and a plurality of transistors disposed in the display area on the panel;
an encapsulation layer disposed on the light emitting element and the plurality of transistors;
at least one connection prevention part in the camera hole area, wherein the at least one connection prevention part includes one or more structures each having a first portion having a first width and a second portion above the first portion having a second width wider than the first width;
at least one dam disposed between the at least one connection prevention part and the camera hole, the at least one dam continuously formed around the camera hole; and
a power line and a signal line disposed in the non-display area.

14. The display apparatus of claim 13, wherein the one or more structures includes a structure having a lower portion and an upper portion having a reversed taper shape where a width of the upper portion incrementally increases away from the panel.

15. The display apparatus of claim 13, wherein the one or more structures includes a structure having a lower portion and an upper portion on the lower portion, wherein a side surface of the upper portion protrudes beyond a side surface of the lower portion.

16. The display apparatus of claim 13,
wherein the at least one connection prevention part is continuously formed around the camera hole and is disposed farther away from the camera hole than the at least one dam.

17. The display apparatus of claim 13,
wherein the power line and the signal line are disposed to surround at least a part of the at least one connection prevention part and the at least one dam, and wherein the power line and the signal line are disposed farther away from the camera hole than the at least one connection prevention part and the at least one dam.

18. The display apparatus of claim 13,
wherein the at least one connection prevention part includes a first prevention part and a second prevention part, wherein the one or more structures include at least a first structure of the first prevention part and at least a second structure of the second prevention part,
the first prevention part is disposed between the second prevention part and the camera hole.

19. The display apparatus of claim 18,
wherein the encapsulation layer includes a first inorganic insulating layer, an organic insulating layer, and a second inorganic insulating layer, and
the organic insulating layer overlaps with the second prevention part.

20. The display apparatus of claim 18,
wherein one of the first structure and the second structure has an upper portion on a lower portion, a side surface of the upper portion protruding beyond a side surface of the lower portion, and
the remaining one of the first structure and the second structure includes another upper portion having a reversed taper shape.

21. The display apparatus of claim 13,
wherein the encapsulation layer includes a first inorganic insulating layer, an organic insulating layer, and a second inorganic insulating layer,
wherein the one or more structures of the at least one connection prevention part includes a structure having a lower portion and an upper portion having a reversed taper shape, and
an upper surface of the structure is covered by the first inorganic insulating layer.

22. The display apparatus of claim 13,
wherein the at least one connection prevention part is disposed on an insulating film on the substrate,
wherein the light emitting element includes a light emitting stack, a first part of the light emitting stack disposed on the insulating film adjacent to a side surface of the at least one connection prevention part, and a second part of the light emitting stack disposed on a top surface of the at least one connection prevention part, and wherein the first part is disconnected from the second part.

23. A display apparatus comprising:
a panel including a substrate and having a display area, a camera hole area formed with a camera hole, and a non-display area disposed between the display area and the camera hole area;
a light emitting element including a light emitting stack, and a plurality of transistors disposed in the display area on the panel;
a connection prevention part on an insulating film on the substrate, wherein the connection prevention part includes a first prevention part and a second prevention part, and the first prevention part and the second prevention part includes one or more structures each having a first portion having a first width and a second portion above the first portion having a second width wider than the first width; and a dam disposed in the camera hole area, wherein the dam is disposed between the connection prevention part and the camera hole, and wherein a first part of the light emitting stack is disposed on the insulating film adjacent to a side surface of the at least one connection prevention part, and a second part of the light emitting stack is disposed on a top surface of the at least one connection prevention part, and wherein the first part is disconnected from the second part, wherein the dam includes a first dam and a second dam, and wherein the first dam, the first prevention part, the second dam, and the second prevention part are sequentially disposed around the camera hole.

24. The display apparatus of claim 23,
wherein the one or more structures includes a structure having a lower portion and an upper portion having a reversed taper shape.

25. The display apparatus of claim 23,
wherein the one or more structures includes a structure having a lower portion and an upper portion on the lower portion, wherein a side surface of the upper portion protrudes beyond a side surface of the lower portion.

* * * * *